(12) United States Patent
Schneider et al.

(10) Patent No.: US 8,043,934 B2
(45) Date of Patent: Oct. 25, 2011

(54) METHODS OF USE AND FORMATION OF A LATERAL BIPOLAR TRANSISTOR WITH COUNTER-DOPED IMPLANT REGIONS UNDER COLLECTOR AND/OR EMITTER REGIONS

(75) Inventors: Jens Schneider, Munich (DE); Martin Wendel, Hohenbrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/912,437

(22) Filed: Oct. 26, 2010

(65) Prior Publication Data
US 2011/0038085 A1 Feb. 17, 2011

Related U.S. Application Data

(62) Division of application No. 11/092,368, filed on Mar. 29, 2005, now Pat. No. 7,875,933.

(51) Int. Cl.
*H01L 21/76* (2006.01)
(52) U.S. Cl. ................... 438/433; 257/E21.545
(58) Field of Classification Search ........... 257/E21.545; 438/433
See application file for complete search history.

(56) References Cited

U.S. PATENT DOCUMENTS

| | | |
|---|---|---|
| 4,400,711 A | 8/1983 | Avery |
| 5,012,317 A | 4/1991 | Rountre |
| 5,374,565 A | 12/1994 | Hsue et al. |
| 5,578,860 A | 11/1996 | Costa et al. |
| 5,581,104 A | 12/1996 | Lowrey et al. |
| 5,674,761 A | 10/1997 | Chang et al. |
| 5,747,837 A * | 5/1998 | Iwase et al. ............. 257/173 |
| 5,804,860 A | 9/1998 | Amerasekera |
| 6,172,404 B1 | 1/2001 | Chen et al. |
| 6,177,324 B1 | 1/2001 | Song et al. |
| 6,242,793 B1 | 6/2001 | Colombo et al. |
| 6,337,501 B1 | 1/2002 | Fukuda et al. |
| 6,417,541 B1 | 7/2002 | Cai et al. |
| 6,503,793 B1 | 1/2003 | Chittipeddi et al. |
| 6,657,835 B2 | 12/2003 | Ker et al. |
| 6,710,990 B2 | 3/2004 | Walker et al. |
| 6,724,050 B2 | 4/2004 | Salling et al. |

(Continued)

FOREIGN PATENT DOCUMENTS

CN 1140900 A 1/1997

(Continued)

OTHER PUBLICATIONS

Bock, K., et al., "Influence of well profile and gate length on the ESD performance of a fully silicided 0.25μm CMOS technology," IEEE Transactions on Components, Packaging, and Manufacturing Technology, Part C, Oct. 1998, vol. 21, No. 4, pp. 286-294.

*Primary Examiner* — Howard Weiss
(74) *Attorney, Agent, or Firm* — Slater & Matsil, L.L.P.

(57) ABSTRACT

A method for protecting a semiconductor circuit from electrostatic discharge is disclosed. An electrostatic discharge is received at a node. Current created by the electrostatic discharge is directed vertically into a semiconductor body, laterally through the semiconductor and beneath a trench isolation region so that the current flows in a direction parallel to an upper surface of the semiconductor body, and to a reference supply node. The reference supply node being formed in a conductive layer disposed over the upper surface of the semiconductor body.

28 Claims, 7 Drawing Sheets

U.S. PATENT DOCUMENTS

| | | |
|---|---|---|
| 6,815,775 B2 | 11/2004 | Ker et al. |
| 6,822,297 B2 | 11/2004 | Nandakumar et al. |
| 6,835,985 B2 | 12/2004 | Cai et al. |
| 6,838,734 B2 | 1/2005 | Ker et al. |
| 6,858,900 B2 | 2/2005 | Chen et al. |
| 2002/0072178 A1 | 6/2002 | Cai et al. |
| 2002/0093102 A1 | 7/2002 | Wendel et al. |
| 2003/0006776 A1 | 1/2003 | Wendel et al. |
| 2003/0227053 A1 | 12/2003 | Nomura et al. |
| 2004/0085691 A1 | 5/2004 | Ker et al. |
| 2004/0245573 A1 | 12/2004 | Uenishi |

FOREIGN PATENT DOCUMENTS

| | | |
|---|---|---|
| CN | 1354516 A | 6/2002 |
| JP | 10-261764 A | 9/1998 |

* cited by examiner

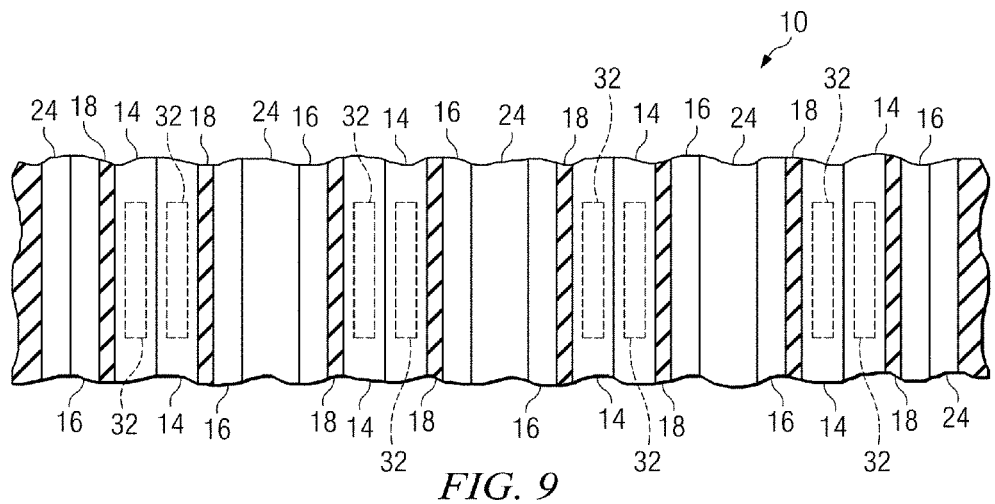
FIG. 9
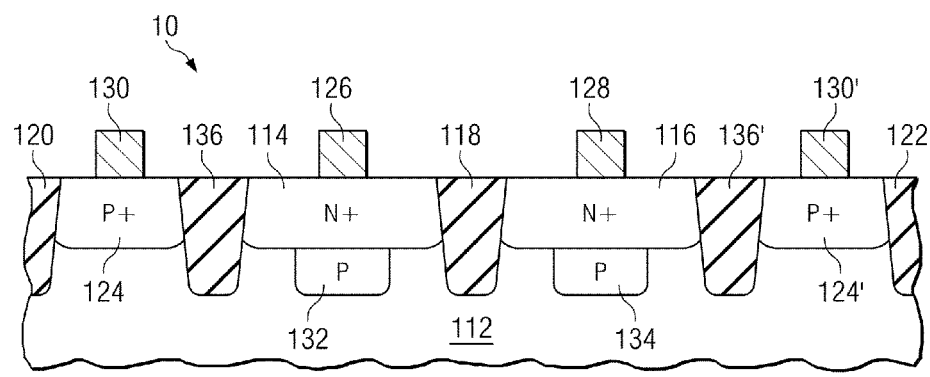
FIG. 10
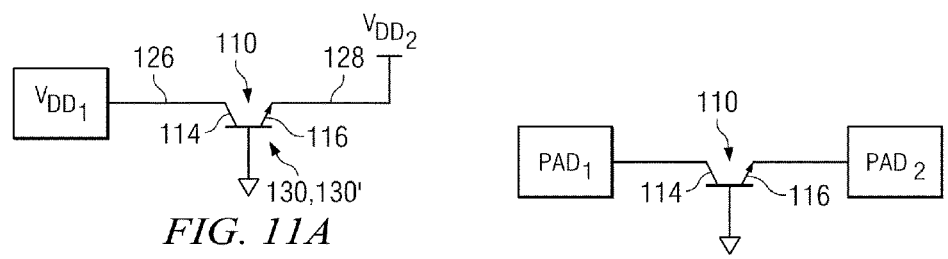
FIG. 11A
FIG. 11B

METHODS OF USE AND FORMATION OF A LATERAL BIPOLAR TRANSISTOR WITH COUNTER-DOPED IMPLANT REGIONS UNDER COLLECTOR AND/OR EMITTER REGIONS

This is a divisional of application Ser. No. 11/092,368, which was filed on Mar. 29, 2005 now U.S. Pat. No. 7,875,933 and is incorporated herein in its entirety.

TECHNICAL FIELD

This invention relates generally to semiconductor devices and methods and more particularly to a lateral bipolar transistor and methods of making the same.

BACKGROUND

To prevent integrated circuits from damage by electrostatic discharge (ESD) events, certain measures must be taken either in the package of a chip or directly on the chip. On-chip protection can be achieved by adhering to ESD specific layout rules, by an optimized process, and by placing ESD protection devices, which directly protect endangered circuits. ESD protection devices establish low-ohmic discharge paths during an ESD event thus keeping high voltages and currents away from the functional circuit elements of the IC.

ESD protection concepts in CMOS technologies are often based on specially designed ESD protection devices such as gate grounded NMOS transistors (ggNMOS), diode strings or SCRs (silicon controlled rectifiers) with trigger elements. In certain cases, none of these devices can be used as a protection element. The most prominent cases are high voltage requirements if only low voltage devices are available. For example, if only thin or medium gate oxides can be used, the standard ggNMOS based on the thick gate oxide is not available for ESD protection.

For the cases described above, there is no good solution based on the usual ESD devices. Neither ggNMOS nor SCRs with trigger elements can be used if there is no thick oxide available. At first sight, stacked NMOS devices might represent a solution but they suffer from severe drawbacks such as holding voltages that are too high and ESD hardness that is too low. In conventional CMOS technologies, lateral bipolar transistors (npn or pnp) are also not suited due to their rather high threshold voltages.

SUMMARY OF THE INVENTION

In one aspect of the invention, a lateral bipolar transistor is formed using CMOS technologies and is used as an ESD protection device. This device is augmented with an additional ESD implant (positive for npn, negative for pnp), which modifies the diffusion-to-well junction and adjusts the device performance to the requirements in modern technologies, e.g., breakdown voltage, threshold voltage, sustaining voltage and differential resistance in the high current regime can be tuned and the destruction current ($I_{t2}$) is enhanced.

In the preferred embodiment, a semiconductor device, which can be operated as a lateral bipolar transistor, includes a semiconductor body of a first conductivity type (e.g., p-type). A first doped region of a second conductivity type (e.g., n-type) is disposed at an upper surface of the semiconductor body. A second doped region of the second conductivity type disposed at the upper surface of the semiconductor body and is separated from the first doped region by an isolation region. A first contact overlies and is electrically coupled to the first doped region and a second contact overlies and is electrically coupled to the second doped region. A third doped region of the first conductivity type is disposed within the semiconductor body beneath the first doped region.

In another aspect, the present invention provides a method for protecting a semiconductor circuit from electrostatic discharge. An electrostatic discharge is received at a node, such as a bond pad. Current created by the electrostatic discharge is directed vertically into a semiconductor body. The current is directed laterally through the semiconductor and beneath a trench isolation region so that the current flows in a direction parallel to the upper surface of the semiconductor body. The current is then directed to a ground node, which is formed in a conductive layer disposed over the upper surface of the semiconductor body. In one example, current is directed from an external connection node (e.g., bond pad) into an implanted semiconductor region of a second conductivity type, then into a semiconductor region of a first conductivity type and then into a semiconductor region of the second conductivity type, before being directed to the ground node.

Embodiments of the invention provide a number of advantages. For example, no gate oxides are needed for the lateral bipolar transistor, so there are no gate related ESD hardness problems (at the protection device). The destruction current ($I_{t2}$) is enhanced with respect to standard ggNMOS protection devices (an analog to ggNMOS with PESD implants). Further, the additional ESD implant allows (to a certain extent independent) tailoring of ESD protection properties such as breakdown voltage $V_{bd}$, threshold voltage $V_{t1}$, sustaining voltage $V_{sp}$ and differential resistance $R_{diff}$ in the high current regime.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 9 is a plan-view of a multi-finger embodiment of the present invention;

FIG. 10 is a cross-sectional view of an alternate embodiment of the invention;

FIGS. 11a and 11b are schematic diagrams implementations of the structure of FIG. 10.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an ESD protection circuit that can be used with semiconductor devices. A preferred embodiment will first be described, followed by specific details of one exemplary embodiment.

Figure 1A:
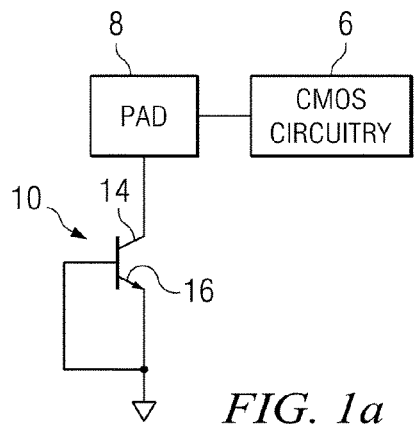
FIGS. 1a, 1b and 1c are schematic diagrams of implementations of embodiments of the invention.

ESD protection devices should be designed to provide a low-ohmic path away from a device or circuit that is being protected during an ESD pulse. FIG. 1a shows a first embodiment of a lateral bipolar transistor 10 that is used for ESD protection of circuitry 6 from an electrostatic discharge event at an external connection node 8. The transistor 10 includes labels for the collector 14 and emitter 16 that correspond to the cross-sectional view shown in FIG. 3. Novel features of the transistor 10 will be discussed below.

The external connection node 8 is provided to represent any node that can experience a high voltage that is to be directed away from circuitry 6. In the figure, the node 6 is labeled as a pad, which is indicative of the commonly used bond pads that can be used to wire bond from an integrated circuit to a point outside of the integrated circuit, e.g., a package and a circuit board. It is understood that integrated circuits with other external connections will benefit equally from aspects of the present invention.

The circuitry 6 is illustrated to represent any elements in an integrated circuit. As will be discussed below, features of the present invention are especially useful with CMOS (complementary metal oxide semiconductor) circuits since the transistor 10 can be fabricated using standard CMOS process flows. That being said, other technologies, such as bipolar and BiCMOS as just two examples, can also benefit from aspects of the present invention.

Figure 1B:
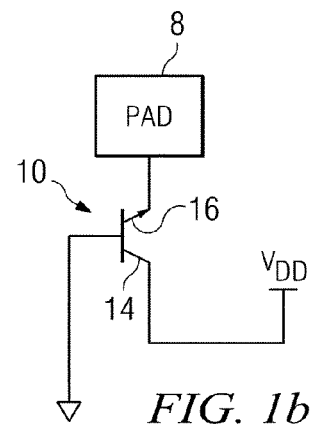

The embodiment of FIG. 1a is designed to protect from a high voltage (e.g. a voltage level greater than the supply voltage $V_{DD}$) at the pad 8 relative. FIG. 1b illustrates a second embodiment that will protect circuitry 6 (not shown in FIG. 1b; see FIG. 1a) from a low voltage (e.g., a voltage less than the ground voltage). In this embodiment, the emitter of the transistor 10 is coupled to the pad and the collector 14 is coupled to the high power supply $V_{DD}$. The base is grounded. Preferably, both the embodiments of FIGS. 1a and 1b are used with each pad 8.

Figure 1C:
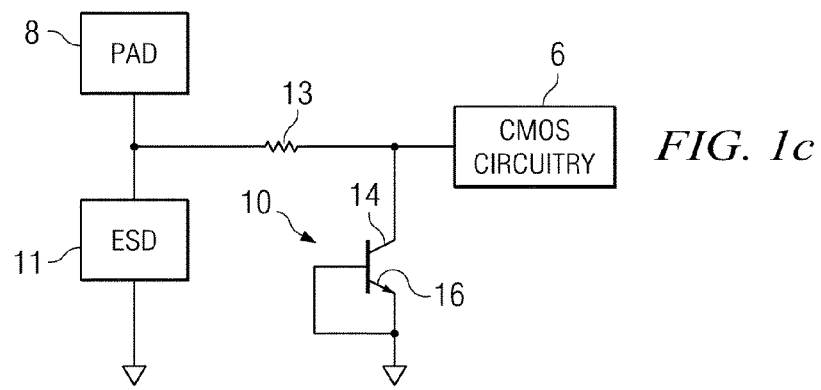

FIG. 1c illustrates a further embodiment where the transistor 10 is used as a second stage of an ESD protection. The main ESD current is carried by a big ESD structure 11 whereas the transistor 10, connected by the resistor 13, protects circuitry 6 against high voltages, e.g. to keep gate oxides from breaking down.

Figure 2:
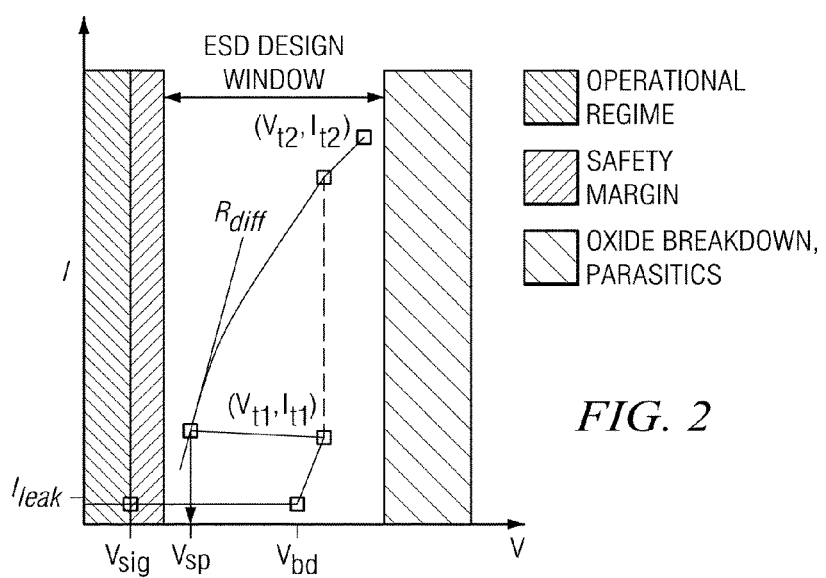
FIG. 2 is a graph showing the current-voltage relationship of a device of an embodiment of the invention.

FIG. 2 shows the high current I-V characteristics of an ESD protection device 10 that is designed to provide a low-ohmic path. The high current characteristics of an ESD protection device should be neither lower than the maximum signal voltage $V_{sig}$ nor higher than the breakdown voltages of parasitic devices and gate oxides. In other words, this curve should be located in a so-called ESD design window that starts above the highest operation voltages (illustrated here to include a safety margin) and ends at the lowest breakdown voltage of oxides and parasitic devices. Operating in this voltage range will prevent both interference with functional devices during operation (at the lower side) and breakdown of these devices during an ESD event (at the upper end of the window). The high current regime is characterized by the breakdown voltage $V_{bd}$, the trigger voltage $V_{t1}$, the holding voltage $V_{sp}$, and the differential high current resistance $R_{diff}$.

For the special requirements mentioned in the Background, the standard protection concepts violate the design-window boundaries. Instead of using these standard approaches, embodiments of the invention rely on a lateral bipolar transistor 10, which inherently does not require the use of gate oxides. Although the invention works in principle for both npn and pnp transistors, for simplicity, the description concentrates on lateral npn (Lnpn) configurations. It is understood that all the details provided apply to Lpnp configurations as well.

Figure 3:
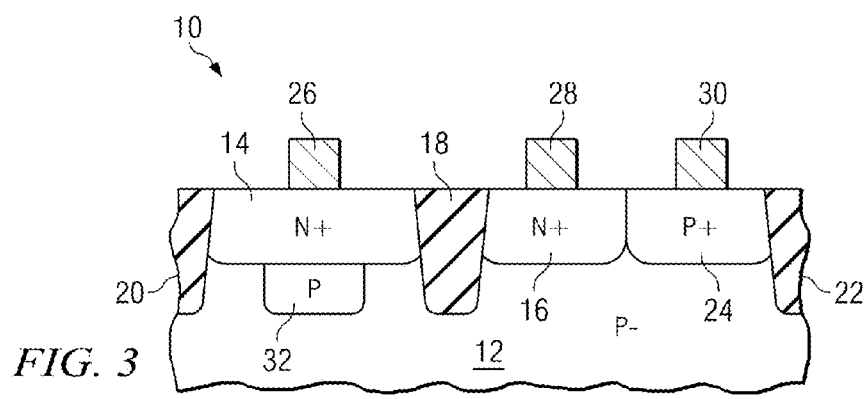
FIG. 3 is a cross-sectional view of one embodiment of the invention.

FIG. 3 illustrates a first embodiment of the present invention. A semiconductor device 10 is formed in a semiconductor body 12. The semiconductor body 12 preferably comprises monocrystalline silicon. In the illustrated embodiment, the body 12 is a p-type substrate. As noted above, the invention works equally well with the polarities of each of the illustrated regions being reversed. In other embodiments, the semiconductor body can be a layer (e.g., an epitaxially grown layer, a silicon-on-insulator layer) or a region formed within another region (e.g., a well).

The device 10 includes a lateral bipolar transistor formed by two doped regions 14 and 16. In the illustrated embodiment, the doped regions 14 and 16 are of n-type on the p-type substrate 12. The doped regions 14 and 16 are separated by an isolation region 18, which in the illustrated embodiment is formed by a shallow trench isolation (STI). In other embodiments, other isolation, such as field oxide or deep trenches, can be used. Isolation regions 20 and 22 are also illustrated and can serve to isolate the device 10 from other devices on the chip.

In the preferred application, the doped regions 14 and 16 form collector and emitter, respectively. The semiconductor body 12 forms the base. In the illustrated embodiment, the body 12 is coupled to a nearby substrate contact 24. As illustrated, the substrate contact 24 can be formed abutting the emitter doped region 16. In an alternate embodiment, an isolation region (not shown) can be included between region 16 and region 24.

Each of the doped regions 14, 16 and 24 can be electrically coupled to other elements in the integrated circuit by contacts 26, 28 and 30, respectively. The contacts 26, 28, and 30 can be formed from any of a number of conductors such as doped polysilicon or metal. In the preferred embodiment, the contacts are formed in the same process as the source/drain and gate contacts of transistors on the same integrated circuit. In some implementations, the regions 16 and 24 are electrically connected. In those cases, the contacts 28 and 30 can be combined into a single contact that is electrically coupled to both regions 16 and 24.

The collector and emitter doped regions 14 and 16 can either be silicided or not. Suitable silicides include titanium silicide, tungsten silicide, cobalt silicide and nickel silicide. If they are blocked from silicidation, the distance between the collector contact and the STI 18 distance can be used for resistance tuning. As will be described below, the distance between the doped region 32 and the STI 18 can also be used for resistance tuning.

The preferred embodiment of the present invention further includes an additional implant 32 in the collector diffusion area 14 to tune the breakdown voltage of the collector-to-base junction. In general, this implant can either be of p- or n-type. For example, the junction between the collector region 14 and the substrate 12 can be altered by using an n-type implantation at the lower part of the doped region 14. This n-type implantation can be in addition to, or instead of, the p-type doped region 32. In one embodiment, the doped region 32 can be realized by a p-type boron implant and, as such, can be referred to as a PESD (p-type electro static discharge) region 32. In the case of a lateral pnp transistor, the doped region 32 would be an n-type region, sometimes referred to as an NESD region.

Figure 4:
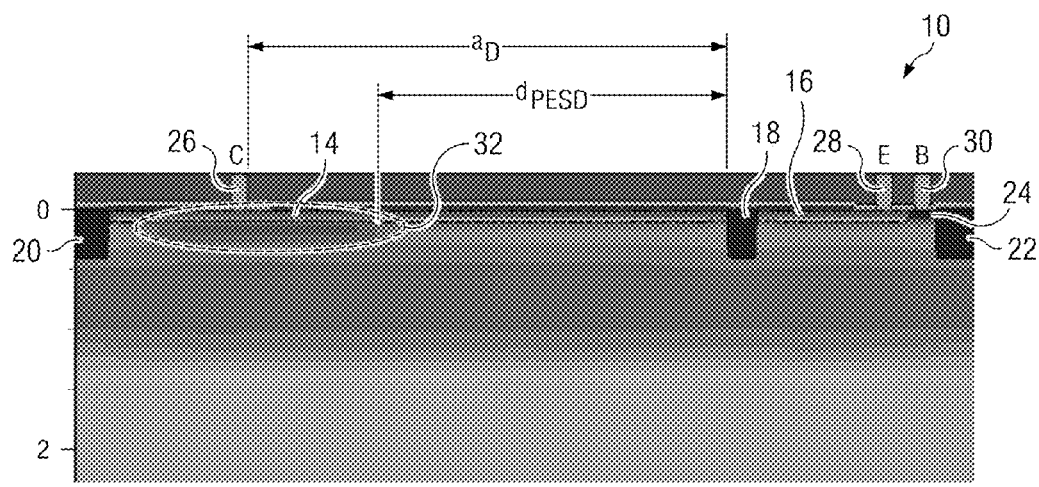
FIG. 4 is a cross-sectional view that illustrates the doping profile of one exemplary embodiment.

The effect of the implant on the doping profile can be seen in FIG. 4, which shows the doping profile of a lateral npn transistor with the additional ESD implant region 32. The regions 14, 16, 24 and 32 and the contacts 26, 28 and 30 are labeled to correspond with FIG. 3. The distance $a_D$ denotes the collector to STI 18 distance and the distance $d_{PESD}$ denotes the PESD region 32 to STI 18 distance. Without the implant, the breakdown voltage $V_{bd}$ would take voltages above 12 V, which is too high for an ESD protection element. With the PESD implant, $V_{bd}$ decreases to about 5.5 V, which is suitable for a protection device.

Figure 5:
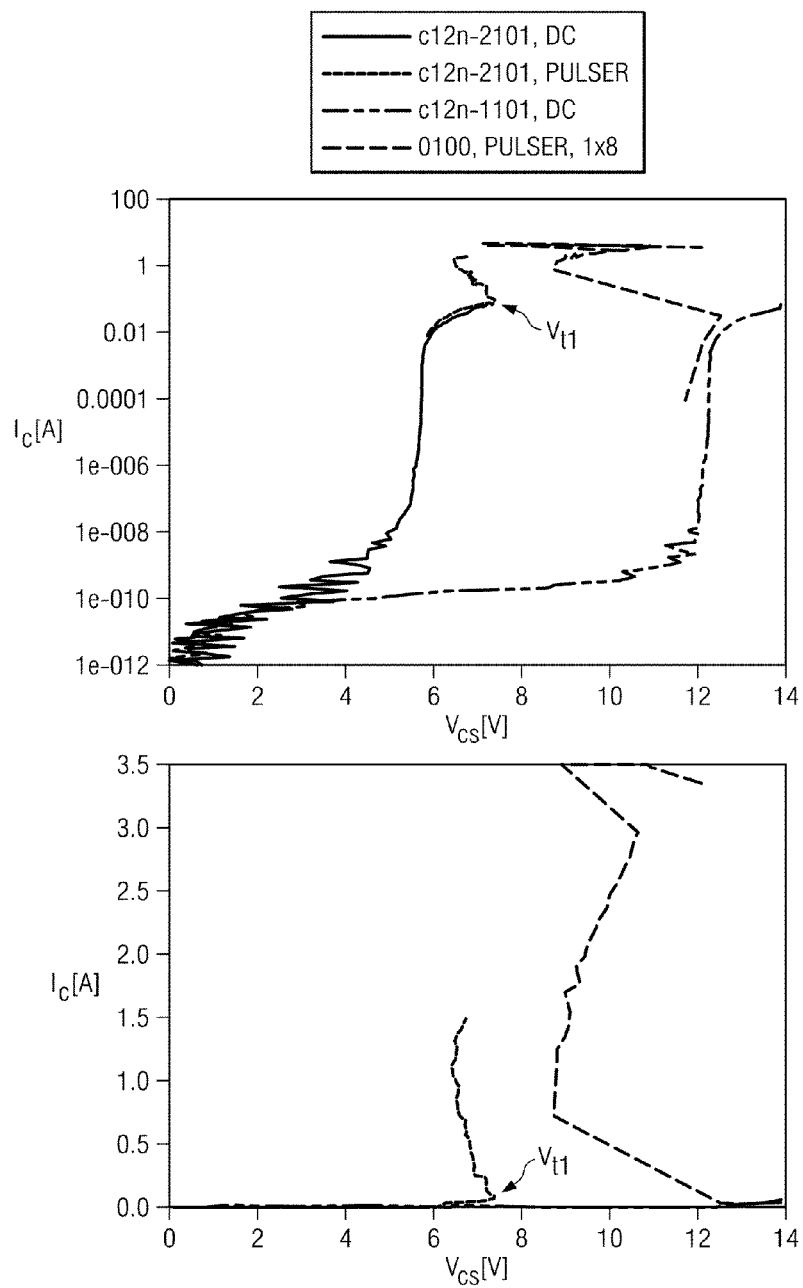
FIG. 5 is a pair of graphs showing current-voltage characteristics.

FIG. 5 illustrates the DC and pulsed I/V characteristics for a lateral npn with (left curve in both plots) and without (right curve in each plot) the additional PESD implant. As can be seen from the figure, the curves of the device that include the additional implant are shifted to lower voltages. The voltage $V_{t1}$ indicates the trigger voltage for snapback. In other words, the additional implant shifts the whole I/V characteristics to lower voltages, thus the triggering condition ($V_{t1}$) for snapback is lowered to an acceptable value.

Figure 6:
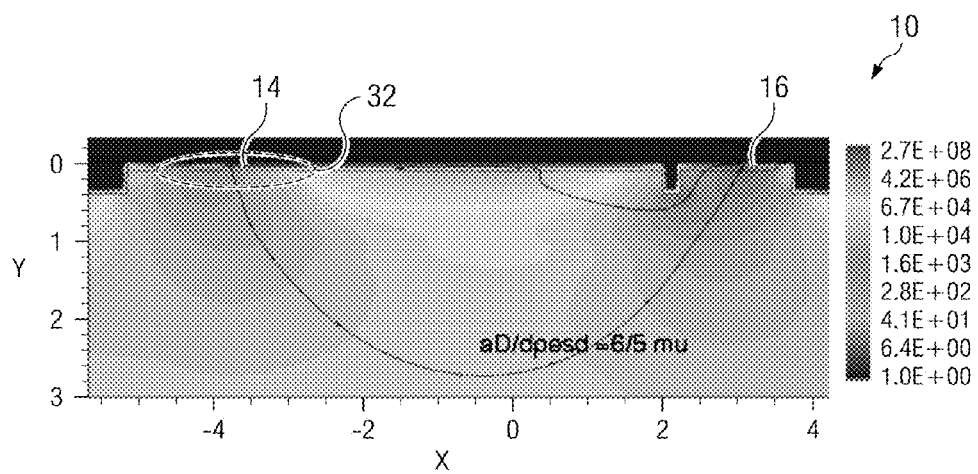
FIG. 6 is a cross-sectional view that illustrates the current density of an exemplary embodiment.

Furthermore, measurements have shown, that the current for device destruction $I_{t2}$ is increased strongly (e.g., by a factor greater than or equal to about 1.5) with respect to a common ggNMOS device without a PESD region. This increase has also been observed in ggNMOS devices with PESD and is due to a different current path during the ESD event, as was found by device simulation. Due to the PESD implant, the current injected at the collector flows vertically (through the implant area) into the substrate. This is illustrated in FIG. 6, which shows the current density during an ESD pulse (device simulation). The main current flows from the collector 14 vertically through the doped area 32 beneath the STI region 18 and then to the emitter 16 on the right.

In the preferred embodiment, the depth of the PESD region 32 from the edge of the collector 16 will be about 10% to 50% of the depth of the collector 16. For example, in a 90 nm technology node, the collector 16 may extend about 100 nm to 200 nm from the surface of the body 12. The PESD region 32 may have a depth (from the edge of the collector) of between about 20 nm to 50 nm. It is expected that these depths will scale as critical dimensions become smaller.

The finding of a different current path allows for a further optimization option. For example, the distance $d_{PESD}$ of the additional implant 32 relative to the central STI 18 can be used to tune the sustaining voltage $V_{sp}$ ("sp" for sustaining point) of the lateral npn transistor 10. In preferred embodiments, the distance $d_{PESD}$ varies between about 0.5 µm and 5 µm for CMOS integrated circuits manufactured using a 90 nm technology. The distance aD between the collector contact 26 and the STI 18 typically varies from about 1 µm to 6 µm for the same technology node.

Figure 7:
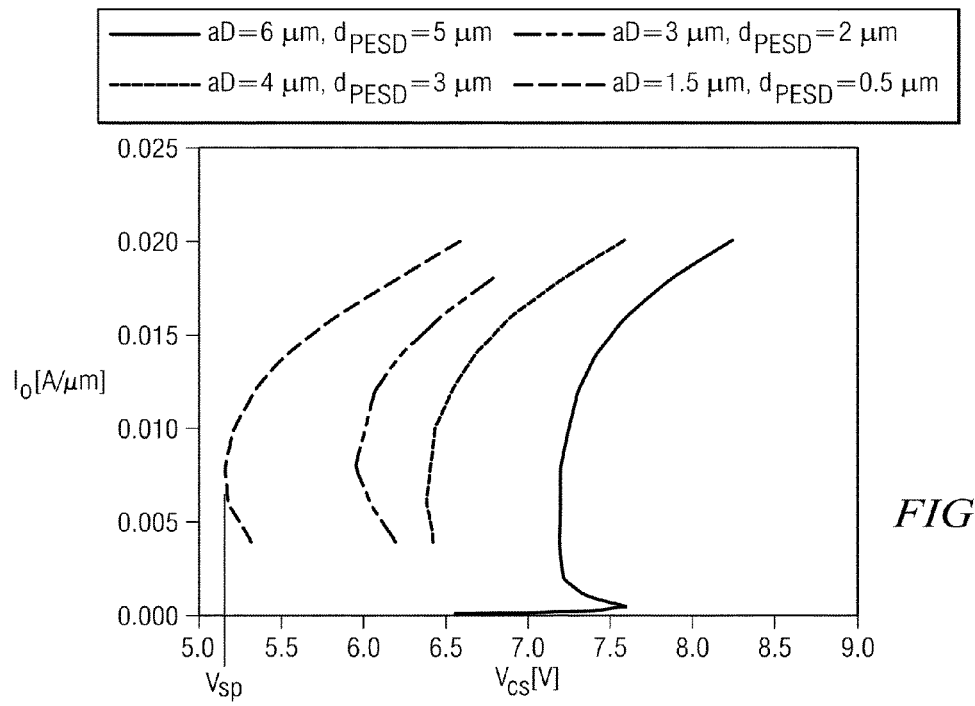
FIG. 7 is a graph that shows device simulation results of I/V characteristics of an exemplary embodiment.

FIG. 7 shows device simulation results of I/V characteristics of a lateral npn with the PESD region 32 for different PESD-to-STI distances $d_{PESD}$ and different collector-contact-to-STI distances $a_D$ (i.e., for a silicide blocked diffusion). For smaller distances $d_{PESD}$, the sustaining voltage $V_{sp}$ is reduced. This dependence reflects the relation between sustaining voltage and base width of a bipolar transistor, that is, the shorter the base is, the lower Vsp. In the present invention, the effective base width is determined by $d_{PESD}$, since the collector current enters the substrate vertically through the PESD implant area 32. In the same spirit, one can change the collector-contact-to-STI distance $a_D$ while keeping $d_{PESD}$ fixed. This allows for an independent tuning of the differential resistance at high current.

Figure 8:
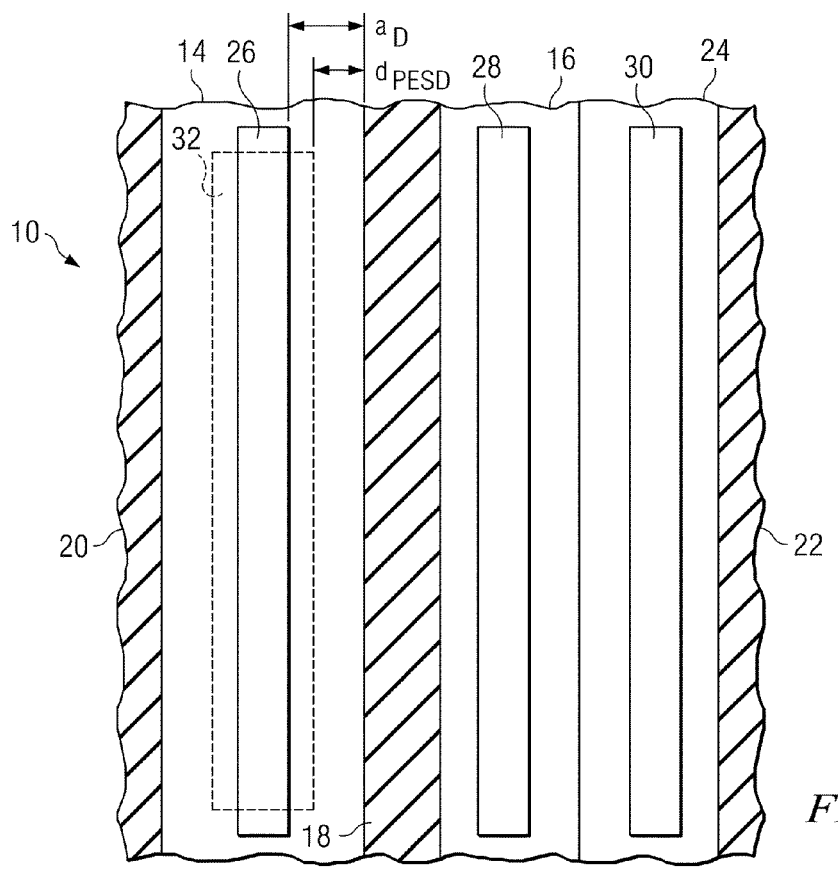
FIG. 8 is a plan-view of an embodiment of the invention.

FIG. 8 illustrates a plan view of the device illustrated in FIG. 3. In this view, the region outlined by the dashed lines represents the area 32 where the PESD implant is applied. The distances $a_D$ and $d_{PESD}$ are also illustrated in the figure. For comparison, these distances are also illustrated in the cross-sectional view of FIG. 4.

FIG. 8 illustrates an embodiment with only one "finger." The preferred embodiment includes several "fingers," i.e., copies of the basic lateral npn device. These fingers are used to scale the threshold current $I_{t2}$ to the high levels (e.g., >1.3 A) needed in real ESD devices. In other words, rather than having a single transistor with a very large width (e.g., 200 µm), the device could be implemented by having eight transistors, each having a smaller width (e.g., 25 µm). Such a multi-finger implementation is shown in FIG. 9.

FIG. 10 illustrates an embodiment with a symmetric lateral bipolar transistor 110. The structure of transistor 110 is similar to that of transistor 10 (FIG. 3) but further includes a doped region 134 beneath the doped region 116. In addition, the body contact regions 124 and 124' are isolated from regions 114 and 116 by isolation regions 136 and 136', respectively. While the doped regions 132 and 134 are illustrated as being below the contacts 126 and 128, respectively, it is understood that these elements can be shifted relative to one another, e.g., to tailor the current path lengths as discussed above.

This symmetric bipolar transistor embodiment is useful for ESD robustness against both positive and negative ESD stress. This embodiment includes a lateral npn device with PESD implants on both the collector and emitter side and has the same distances and widths on both sides of the central STI. This embodiment can either be realized with a single finger or with several fingers.

FIG. 11a illustrates one application of the symmetric lateral bipolar transistor 110. (Since the transistor 110 is symmetric, selection of which node is emitter and which is collector is arbitrary.) In this case, the body contacts 130 and 130' are electrically coupled to ground. One of the doped regions 126 (or 128) is coupled to a first supply voltage $V_{DD1}$. The second doped region 128 (or 126) is coupled to a second supply voltage $V_{DD2}$. In the illustrated embodiment, the doped region 126 is coupled to a $V_{DD1}$ pad (or other external contact) and the doped region 128 is coupled to a $V_{DD2}$ line. In another embodiment, possibly implemented on the same chip as the illustrated embodiment, the doped region 126 can be coupled to a $V_{DD1}$ line and the doped region 128 is coupled to a $V_{DD2}$ external contact. As shown in FIG. 11b, the symmetric transistor 110 can also be used between two different external contacts (labeled $Pad_1$ and $Pad_2$).

A preferred method for fabricating a device as described herein will now be described with respect to FIGS. 12a-12d. These figures show a very simplified version of a CMOS process that can be used to form an n-channel FET, a p-channel FET and a lateral npn transistor. A typical integrated circuit will include thousands or millions of transistors, as well as other elements. The three elements shown here are only to typify the many elements in a chip. As mentioned before, another method could be to use a lateral pnp that could be fabricated within the same CMOS process as described here.

Figure 12A:
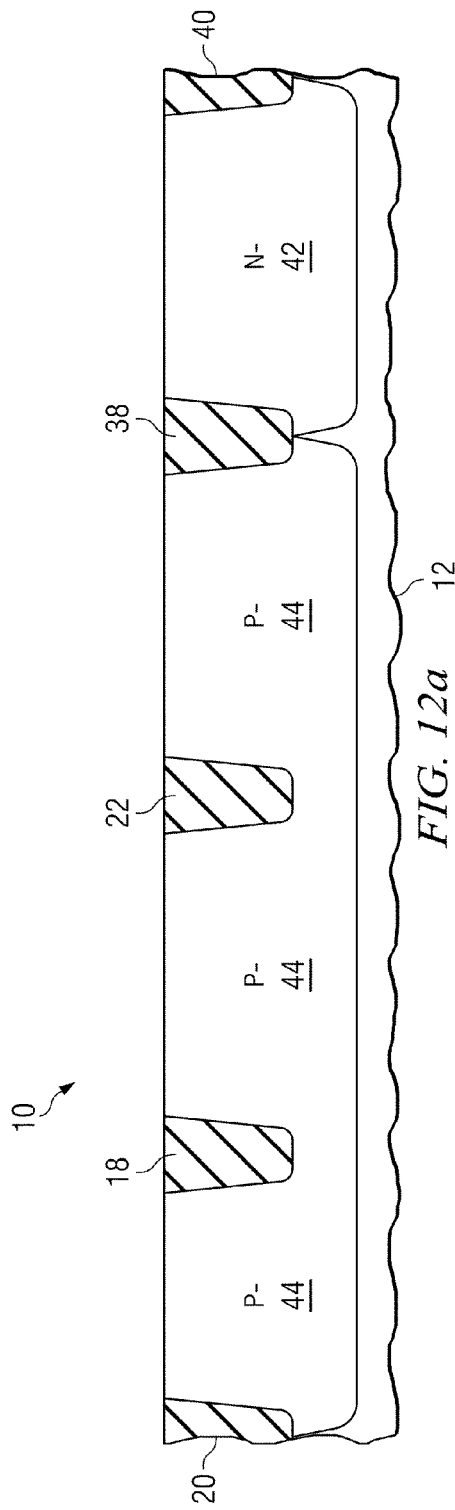
FIGS. 12a-12d show various stages of a fabrication process of the present invention.

Referring first to FIG. 12a, a semiconductor body 12 is provided. STI regions 18, 20, 22, 38 and 40 are formed. In this known process, trenches are etched and filled with a dielectric material, such as silicon oxide. As noted above, other isolation techniques can be used.

In the next step, n-well 42 is formed. The p-channel FETs will be formed in the n-wells 42. In the preferred embodiment, the n-channel transistors (and lateral npn transistor(s)) are formed in p-wells 44. Since the substrate 12 was already doped with p-type dopants, the p-wells are optional. (If an n-type substrate is used, the n-wells would be optional.) In the preferred embodiment, the n-wells are doped to a doping concentration of between about $10^{17}$ and $10^{19}$ cm$^{-3}$ and the p-wells are doped to a doping concentration of between about $10^{17}$ and $10^{19}$ cm$^{-3}$. The peak value of the wells is typically at about 1.5 to 2 times the STI depth. It does not matter which is formed first, the n-well 42 or the p-well 44.

Figure 12B:
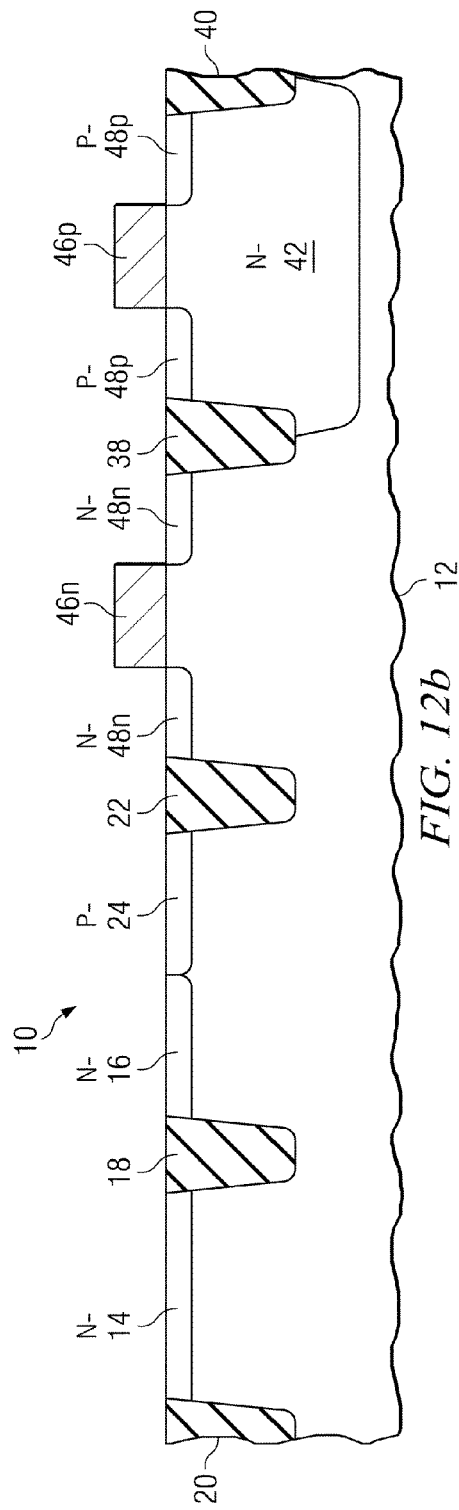

Referring next to FIG. 12b, the gate stacks 46n and 46p are formed for the CMOS transistors. For example, a gate dielectric can be deposited followed by deposition of a gate conductor. For example, the gate dielectric can be silicon oxide, silicon nitride or a high-k dielectric (i.e., a dielectric with a dielectric constant greater than that of silicon nitride). The gate conductor is patterned and etched to form the gates 46n and 46p as shown.

In the preferred embodiment, the gate stacks include doped polysilicon and an overlying silicide layer (e.g., tungsten silicide, titanium silicide, cobalt silicide, nickel silicide). The silicide layer can be deposited or formed by a salicide process (a self-aligned silicide where a refractory metal is blanket deposited and reacted with silicon). Preferably, silicidation is done at the end right before the contacts, for all non blocked regions (so saving a mask if silicide blocking is not required). As discussed above, the silicon regions of the lateral npn transistor are preferably not silicided. If it is determined that blocking the silicide (e.g., using a nitride or other insulator before performing a salicide process) add significant cost, these areas can be silicided as well.

FIG. 12b also shows the formation of lightly doped source and drain (LDD) regions 48. In the MOS transistor regions, these LDD regions 48 are aligned to the gates 46. To form these regions, the n-wells 42 are covered (e.g., with photoresist) and n-type dopants (e.g., arsenic or phosphorus) are doped in the p-wells (aligned with the gates 46n). At the same time, the region 24 is covered and dopants are formed in regions 14 and 16. Alternatively, the entire region of the lateral npn transistor can be either covered or left exposed. Since these regions will be exposed to the higher implantation doses later, this LDD implant will only minimally affect the doping concentration. In the preferred embodiment, the LDD regions 48n are doped to a doping concentration of between about $10^{18}$ and $10^{20}$ cm$^{-3}$ and the LDD regions 48p are doped to a doping concentration of between about $10^{18}$ and $10^{20}$ cm$^{-3}$. After (or before) the n-channel LDDs 48n are formed, the p-channel LDDs 48p can be formed using the same process sequence.

Figure 12C:
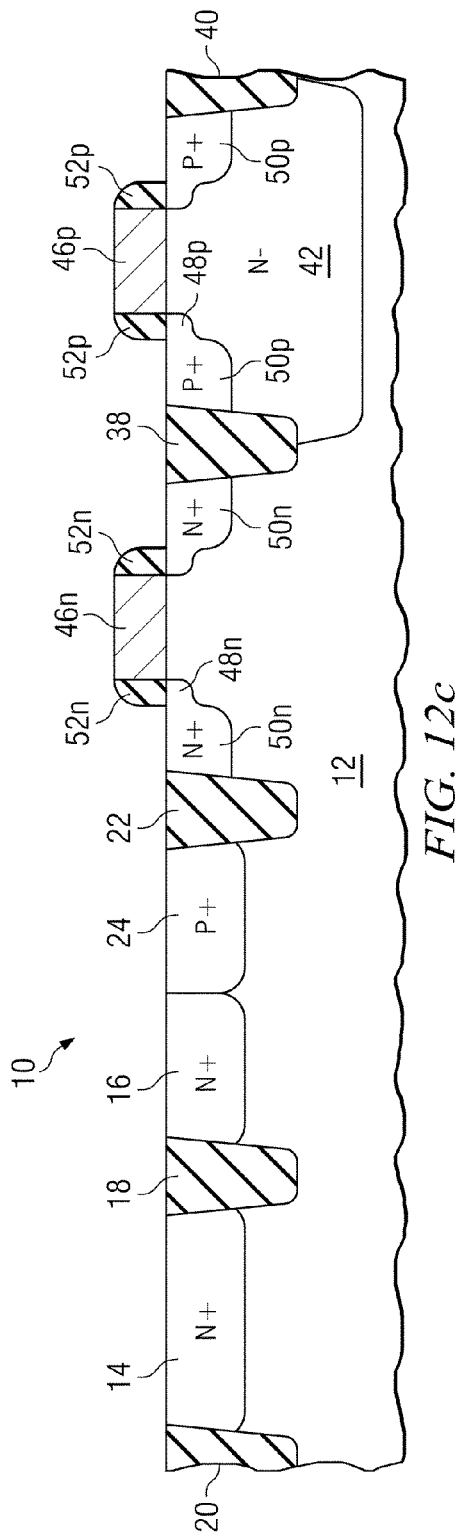

Turning now to FIG. 12c, sidewall spacers 52 are formed along the sidewalls of gate 46 and overlying the LDD regions 48. Typically, sidewall spacers 52 are formed by depositing a conformal dielectric layer (e.g., oxide or nitride or both) and performing an anisotropic etch so that all insulator is removed except the spacers 52 remains along the sidewalls of the gate 46. As shown in the figure, all insulator is removed from over the lateral npn transistor 10.

Next the source and drain regions 50 can be formed. To form the n-doped regions 50n, the n-wells 42 are covered (e.g., with photoresist) and n-type dopants (e.g., arsenic or phosphorus) are doped in the p-wells (aligned with the gate spacers 42n). At the same time, the region 24 is covered and dopants are formed in regions 14 and 16. To form the p-doped regions 50p, the p-wells 44 are covered (e.g., with photoresist) and p-type dopants (e.g., boron) are doped in the n-wells (aligned with the gate spacers 52p). At the same time, the regions 14 and 16 are covered and dopants are formed in region 24. Either polarity source/drain regions 50n or 50p could be formed first.

In the preferred embodiment, the source/drain regions 50n (and regions 14 and 16) are doped to a doping concentration of between about $5 \times 10^{19}$ and $5 \times 10^{20}$ cm$^{-3}$ and the source/drain regions 50p (and region 24) are doped to a doping concentration of between about $5 \times 10^{19}$ and $5 \times 10^{20}$ cm$^{-3}$. For example, the n doped regions 14, 16 and 50n are preferably formed with an implant energy (e.g., for arsenic) of between about 30 and 50 keV and a dose of between about $10^{15}$ and $10^{16}$ cm$^{-2}$.

Figure 12D:
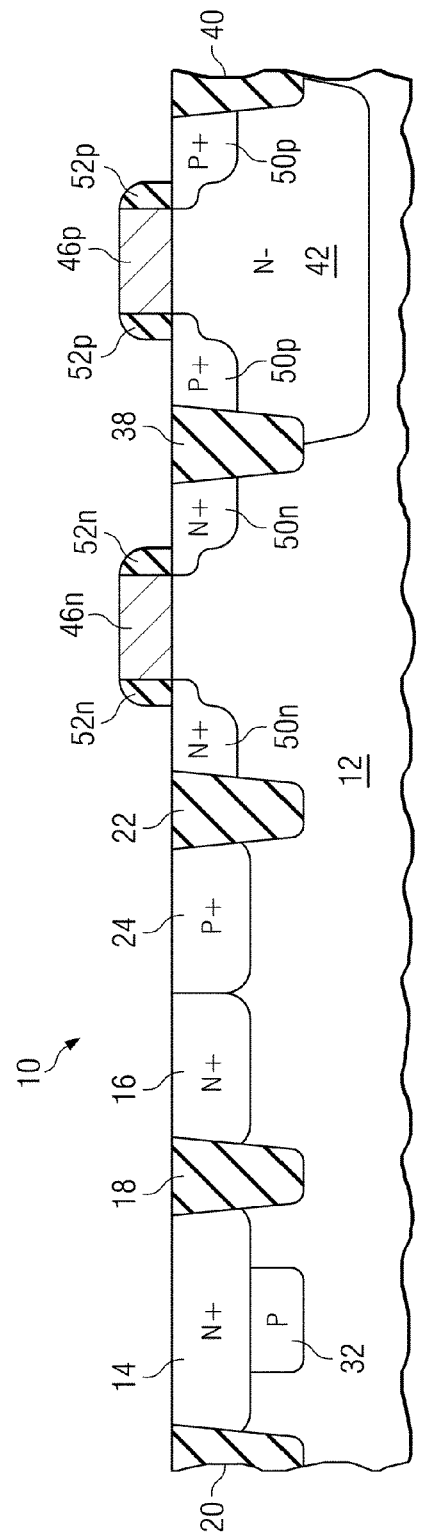

FIG. 12d illustrates the formation of the PESD region 32. This region is formed by forming a mask with an opening over only the area above the PESD region. The PESD region 32 can be formed by implanting a dopant (e.g., boron) with an implant energy of between about 5 and 20 keV and a dose of between about $10^{14}$ and $10^{16}$ cm$^{-2}$. This will create a doped region as described above.

While not illustrated, further processing steps such as formation of dielectric layers, contacts 26, 28, 30 (FIG. 3) and metallization are then performed, as is known in the art. Detailed descriptions of these steps will not be provided herein.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for protecting a semiconductor circuit from electrostatic discharge, the comprising:
   receiving an electrostatic discharge at a node;
   directing current created by the electrostatic discharge vertically into a semiconductor body;
   directing the current laterally through the semiconductor and beneath a first isolation region so that the current flows in a direction parallel to an upper surface of the semiconductor body; and
   directing the current to a reference supply node, the reference supply node being formed in a conductive layer disposed over the upper surface of the semiconductor body, wherein the semiconductor circuit is protected by a protection device that comprises:
   a first doped region of a second conductivity type disposed at an upper surface of the semiconductor body, the semiconductor body having a first conductivity type that is different than the second conductivity type;
   a second doped region of the second conductivity type disposed at the upper surface of the semiconductor body, wherein the first isolation region is disposed within the semiconductor body between the first doped region and the second doped region;

a third doped region of the first conductivity type disposed within the semiconductor body beneath the first doped region;

a fourth doped region of the first conductivity type disposed at the upper surface of the semiconductor body;

a second isolation region disposed within the semiconductor body between the second doped region and the fourth doped region;

a fifth doped region of the first conductivity type disposed at the upper surface of the semiconductor body; and a third isolation region disposed within the semiconductor body between the first doped region and the fifth doped region, wherein the first isolation region physically abuts both the first doped region and the second doped region, wherein the second isolation region physically abuts the second doped region and the fourth doped region, and wherein the third isolation region physically abuts the first doped region and the fifth doped region.

2. The method of claim 1, wherein directing current created by the electrostatic discharge vertically into the semiconductor body comprises directing current from an external connection node into an implanted semiconductor region of a second conductivity type and then into semiconductor body of a first conductivity type and then into an implanted semiconductor of the second conductivity type.

3. The method of claim 1, wherein the current is directed to a depth of at least 120 nm below an upper surface of the semiconductor body.

4. The method of claim 1, wherein the reference supply node comprises a ground node.

5. The method of claim 1, wherein the reference supply node comprises a VDD node.

6. The method of claim 1, wherein receiving the electrostatic discharge at a node comprises receiving the electrostatic discharge at an external pad.

7. The method of claim 1, wherein receiving the electrostatic discharge at a node comprises receiving the electrostatic discharge at a voltage supply node.

8. The method of claim 1, wherein the protection device further comprises:

a first contact overlying and electrically coupled to the first doped region;

a second contact overlying and electrically coupled to the second doped region; and wherein:

the electrostatic discharge is received at a node electrically coupled to the first doped region;

the current is directed vertically into the third doped region; and the current is directed to the reference supply node through the second doped region.

9. The method of claim 8, wherein the first contact is laterally spaced from the isolation region by a distance between about 1 µm and about 6 µm and wherein an edge of the third doped region is laterally spaced from the isolation region by a distance between about 0.5 µm and about 5 µm.

10. The method of claim 9, wherein the semiconductor circuit is manufactured using a 90 nm technology node.

11. The method of claim 8, wherein the protection device further comprises a sixth doped region of the first conductivity type disposed within the semiconductor body beneath the second doped region, wherein the current is directed from beneath the first isolation region to the reference supply node via the sixth doped region.

12. The method of claim 11, wherein the protection device further comprises:

a ground node electrically coupled to the fourth doped region and the fifth doped region;

a first voltage supply node electrically coupled to the first doped region, wherein the electrostatic discharge is received at the first voltage supply node; and a second supply voltage node electrically coupled to the second doped region.

13. A method of fabricating a semiconductor device, the method comprising:

forming a first doped region of a second conductivity type at an upper surface of a semiconductor body of a first conductivity type, the second conductivity type being different than the first conductivity type;

forming a second doped region of the second conductivity type at the upper surface of the semiconductor body;

forming an isolation region within the semiconductor body between the first doped region and the second doped region, the isolation region physically abutting both the first doped region and the second doped region;

forming a third doped region of the first conductivity type within the semiconductor body beneath the first doped region;

forming a fourth doped region of the first conductivity type at the upper surface of the semiconductor body;

forming a second isolation region within the semiconductor body between the second doped region and the fourth doped region, the second isolation region physically abutting the second doped region and the fourth doped region;

forming a fifth doped region of the first conductivity type disposed within the semiconductor body beneath the second doped region;

forming a sixth doped region of the first conductivity type disposed at the surface of the semiconductor body; and forming a third isolation region disposed within the semiconductor body between the first doped region and the sixth doped region, the third isolation region physically abutting the first doped region and the sixth doped region.

14. The method of claim 13, further comprising forming integrated circuitry in the semiconductor body, the integrated circuitry being formed using a 90 nm technology node.

15. The method of claim 13, wherein forming the third doped region comprises implanting dopants of the first conductivity type through the first doped region.

16. The method of claim 15, wherein forming the fifth doped region comprises implanting dopants of the first conductivity type through the second doped region.

17. The method of claim 13, further comprising:

electrically coupling the fourth doped region and the sixth doped region to a ground node;

electrically coupling the first doped region to a first voltage supply node; and electrically coupling the second doped region to a second supply voltage node.

18. The method of claim 17, wherein the first voltage supply node comprises an external connection node and wherein the second voltage supply node comprises a conductive line.

19. The method of claim 13, further comprising:

forming a first contact over and electrically coupled to the first doped region; and forming a second contact over and electrically coupled to the second doped region.

20. The method of claim 19, wherein forming the second contact comprises electrically coupling the second doped region to a ground node.

21. The method of claim 19, wherein forming the first contact comprises electrically coupling the first doped region to an external connection node through a resistor.

22. The method of claim 13, wherein an edge of the third doped region is laterally spaced from the isolation region by a distance between about 0.5 μm and about 5 μm.

23. The method of claim 13, further comprising forming a first contact over the first doped region, wherein the first contact is laterally spaced from the isolation region by a distance between about 1 μm and about 6 μm.

24. A method of fabricating a semiconductor device, the method comprising:
forming a base region of a first conductivity type disposed in a semiconductor body;
forming a first heavily doped region of a second conductivity type over the base region at an upper surface of the semiconductor body, the second conductivity type being different than the first conductivity type;
forming a second heavily doped region of the second conductivity type over the base region at the upper surface of the semiconductor body;
forming a first isolation region within the semiconductor body between the first heavily doped region and the second heavily doped region, the first isolation region physically abutting both the first heavily doped region and the second heavily doped region; and
forming a first doped region of the first conductivity type within the semiconductor body beneath the first heavily doped region, the first doped region contacting the first heavily doped region and the base region.

25. The method of claim 24, further comprising:
forming a third heavily doped region of the first conductivity type over the base region at the upper surface of the semiconductor body, the third heavily doped region contacting the second heavily doped region laterally;
forming a second isolation region within the semiconductor body physically abutting the third heavily doped region; and
forming a third isolation region disposed within the semiconductor body physically abutting the first heavily doped region.

26. The method of claim 25, wherein the second heavily doped region contacts the base region, and wherein the third heavily doped region contacts the base region.

27. The method of claim 24, wherein the first doped region has a smaller lateral critical dimension than the first heavily doped region.

28. The method of claim 24, wherein a first portion of the first heavily doped region contacts the base region and a second portion of the first heavily doped region contacts the first doped region.

* * * * *